United States Patent [19]

Lindner et al.

[11] 4,405,925
[45] Sep. 20, 1983

[54] MICROWAVE TRANSCEIVER, PARTICULARLY FOR A DOPPLER RADAR SYSTEM

[75] Inventors: Kurt Lindner, Ulm; Theodor Schütz, Memmingen, both of Fed. Rep. of Germany

[73] Assignee: Licentia Patent-Verwaltungs-GmbH, Frankfurt am Main, Fed. Rep. of Germany

[21] Appl. No.: 246,693

[22] Filed: Mar. 23, 1981

[30] Foreign Application Priority Data

Mar. 22, 1980 [DE] Fed. Rep. of Germany ....... 3011238

[51] Int. Cl.³ .............................................. G01S 13/56
[52] U.S. Cl. ............................... 343/5 PD; 343/5 TM
[58] Field of Search ......................... 343/5 PD, 5 TM

[56] References Cited

U.S. PATENT DOCUMENTS

| 3,668,703 | 6/1972 | Klein | 343/5 TM X |
| 3,803,514 | 4/1974 | Camp, Jr. | 331/107 G |
| 4,053,897 | 10/1977 | Nerheim | 343/5 PD X |
| 4,200,870 | 4/1980 | Gabbitas | 343/5 PD |

OTHER PUBLICATIONS

Kwok et al., Low Cost X-Band MIC Baritt Doppler Sensor, IEEE Transactions, vol. MTT-27, No. 10, Oct. 1979.

*Primary Examiner*—T. H. Tubbesing
*Attorney, Agent, or Firm*—Spencer, Kaye & Frank

[57] ABSTRACT

In a microwave transceiver including a dielectric antenna and a self-oscillating semiconductor mixer stage for both generating a microwave signal to be transmitted via the antenna and mixing that microwave signal with reflected microwave signal components received by the antenna, the mixer stage being composed of a nonlinear microwave diode connected to give the stage a negative impedance to permit oscillation and to effect mixing, and a half-wavelength disc-type resonator providing a resonant circuit for the oscillator and having the form of a stripline piece element composed of two strip conductors between which the microwave diode is electrically conductively connected, the antenna being disposed on one of the strip conductors, the resonator and antenna are constructed to be axially symmetrical and are positioned coaxially to one another.

12 Claims, 3 Drawing Figures

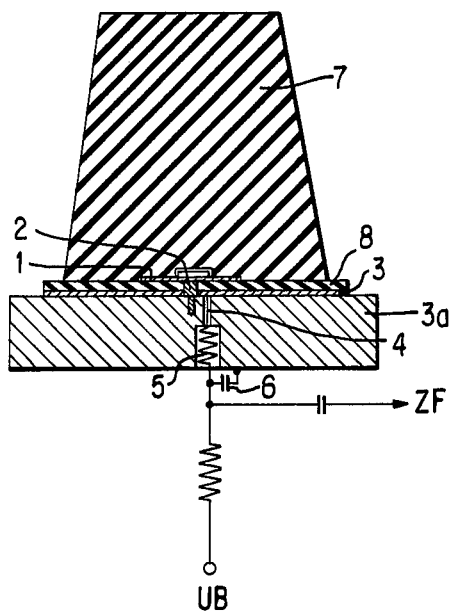
FIG. 1
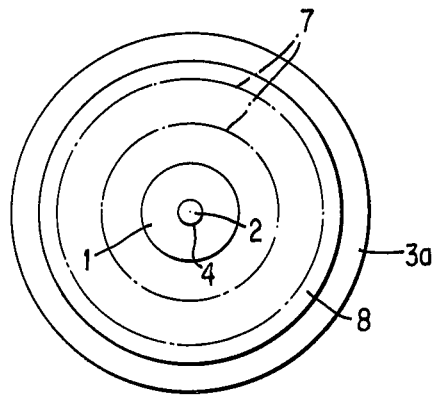
FIG. 2
FIG. 3
(PRIOR ART)
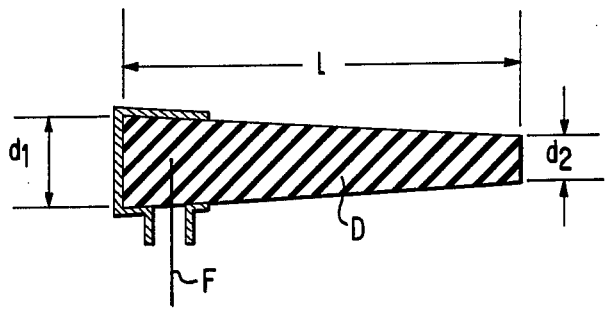

MICROWAVE TRANSCEIVER, PARTICULARLY FOR A DOPPLER RADAR SYSTEM

BACKGROUND OF THE INVENTION

The present invention relates to a microwave transmitter/receiver of the type including an antenna, and a self-oscillating semiconductor mixer stage for both generating a microwave signal to be transmitted via the antenna and mixing that microwave signal with reflected microwave signal components received by the antenna, the mixer stage being composed of a nonlinear microwave diode connected to give the stage a negative impedance to permit oscillation and to effect mixing, and a half-wavelength disc-type resonator providing a resonant circuit for the oscillator and having the form of a stripline piece element composed of two strip conductors between which the microwave diode is electrically conductively connected. One embodiment of such a device is disclosed in French Published Patent Application Ser. No. 2,122,341.

Broadly stated, the invention is thus based on a microwave transceiver having a self-mixing semiconductor oscillator stage composed of a nonlinear microwave diode in a resonator. The oscillator oscillation generated by this arrangement is emitted via an antenna and reflections thereof are received by the same antenna after being reflected by an object to be detected. The received, reflected signals are then mixed with the oscillator oscillation by the same arrangement which serves to generate the oscillation to be transmitted and which is now used as a mixer stage. The intermediate frequency signal resulting from this mixing is the Doppler signal which permits a determination of the difference frequency between the transmitted oscillation and the received oscillation and thus is a measure for the relative speed of the object to be detected.

Thus, the generated oscillation is the transmitter signal as well as the local oscillator signal for the microwave diode acting as mixer and this oscillation simultaneously contributes, in a deattenuating, or negative resistance, manner, to the generation of an oscillation in the resonator. Appropriately matched microwave diodes, e.g. BARITT diodes, Gunn diodes, IMPATT diodes, tunnel diodes, are known to deattenuate resonators and excite them into oscillations. Due to their nonlinear characteristics, they are additionally able to operate as receiver mixers and permit operation of a self-oscillating mixer stage.

Fields of application for such known transceivers are radar instruments, e.g. Doppler radar systems, for measuring the speed of an object, for example to prevent theft, avoid collisions in highway traffic or for railbound traffic, and also to detect the speed of projectiles in which such a transceiver may be installed.

In some of the possible fields of application it is of importance that such a transceiver be small, structurally simple and inexpensive.

SUMMARY OF THE INVENTION

It is therefore an object of the present invention to provide a microwave transceiver of the above-described type which is as small as possible and which is both mechanically and electrically simple.

The above and other objects are achieved, according to the invention, in a microwave transceiver including an antenna, and a self-oscillating semiconductor mixer stage for both generating a microwave signal to be transmitted via the antenna and mixing that microwave signal with reflected microwave signal components received by the antenna, the mixer stage being composed of a nonlinear microwave diode connected to give the stage a negative impedance to permit oscillation and to effect mixing, and a half-wavelength disc-type resonator providing a resonant circuit for the oscillator and having the form of a stripline piece element composed of a two strip conductors between which the microwave diode is electrically conductively connected, the antenna being a dielectric antenna disposed on one of the strip conductors, the diode having at least one lead which is brought through the resonator, and the transceiver further including a high frequency choke disposed on the side of the resonator facing away from the antenna and connected to the one diode lead, by constructing the resonator and antenna to be axially symmetrical and positioning them coaxially to one another.

The basic concept underlying the invention is the following: To simplify, and reduce the size of, the mechanical and electrical structure, the resonator is constituted by a half-wavelength resonator having the form of a piece of stripline between the two strip conductors of which the microwave diode is inserted in an electrically conductive manner. A dielectric antenna is arranged directly on one of the strip conductors while a diode lead is brought through the resonator onto the other side of the stripline, where a high frequency choke is disposed in the diode lead to prevent loss of the microwave energy to be transmitted.

BRIEF DESCRIPTION OF THE DRAWING

FIG. 1 is a cross-sectional elevational view of a microwave transceiver according to a preferred embodiment of the invention.

FIG. 2 is a top plan view of the structure of FIG. 1, with the dielectric antenna assumed to be transparent.

FIG. 3 is a cross-sectional view of an antenna known per se, parts of which can be included in an embodiment of the invention.

DESCRIPTION OF THE PREFERRED EMBODIMENTS

In the illustrated embodiment, a circular half-wavelength resonator is provided in stripline form and is disposed between a first strip conductor 1 and a second strip conductor which serves as the return, or ground plane, conductor 3, with a dielectric substrate 8 disposed therebetween. Each of conductors 1 and 3 is in the form of a circular disc. A microwave diode 2, preferably constituted by a BARITT diode, is disposed coaxially with the center axis of the resonator and is soldered into the first strip conductor 1.

On the other side of the resonator, the return conductor 3 is electrically and heat conductively connected with a heat sink 3a which is electrically at reference, or ground, potential. Part of the microwave diode 2 is disposed in the heat sink in an electrically conductive and heat conductive manner so that the necessary dissipation of heat from the microwave diode is assured.

The other end of the microwave diode, which is electrically connected with the first strip conductor 1, additionally requires an electric lead 4 which serves as a direct voltage lead as well as the intermediate frequency output. The lead 4 is a thin wire which is brought through a bore in the resonator and into the heat sink 3a in the immediate vicinity of the microwave diode 2. Loss of microwave energy generated in the resonator through the lead 4 is prevented by a high frequency choke 5. Any microwave oscillations that might still get through this high frequency choke are short-circuited to ground by means of a capacitor 6.

A dielectric antenna 7 of frustoconical shape has its base surface, the diameter of which is larger than that of the first strip conductor 1, arranged directly on the resonator in such a manner that the electromagnetic energy is coupled directly, i.e. without leads between the antenna and the resonator. The degree of coupling can here be influenced by the selection of the relative dielectric constant of the cone frustum which here serves as the antenna and by the selection of the material of substrate 8; low values for the relative dielectric constant of the antenna material result in a very loose coupling to the resonator. Likewise, coupling can be varied by varying the antenna diameter at the resonator end, since it is possible, particularly at the high resistance resonator edge, to draw field lines from the substrate 8 into the antenna. Gain, opening angle and radiation pattern depend substantially on the dimensioning of the antenna and are generally known.

With an essentially axially symmetrical design of the resonator and the antenna and mutually coaxial association together with the microwave diode 2, it is a characteristic of this arrangement that due to the radially flowing currents in the resonator, the antenna lobe pattern will have a zero value along the longitudinal axis of the antenna.

The axially symmetrical design is of particular advantage if the resulting arrangement is used in a flying body which moves with a spin around the direction of flight, for example a projectile, in which case the antenna axis should be aligned in parallel with the spin axis. In this way, the resulting antenna pattern will be independent of spin.

An antenna structure which can be utilized as the "dielectric antenna" 7 of the illustrated embodiment of the invention is described for example by Mallach in "Fernmeldetechnische Zeitschrift", February 1949, pages 33–39 especially in the lowest portion of FIG. 1. An antenna of this type is illustrated in FIG. 3 accompanying this specification. This antenna structure includes a dielectric rod D which can be fed by a dipole or monopole F at one end and acts as a directive antenna. The directivity is caused by different phase velocities in the dielectric and air. By shaping the rod conical, a better matching from feed to air is accomplished. Instead of a feeding dipole, the resonator itself (which also acts as a stripline antenna) can be positioned and excite the antenna. That means that no further connections are necessary and the dielectric cone 7 may be placed directly on top of the resonator 8 and fixed by glue or screws. Depending on the application, a separate radome or the antenna itself can protect the module.

It has been found that on the one hand the larger diameter $d_1$ (i.e. the base diameter) of the antenna can be calculated by:

$$d_1 \approx \frac{\lambda_0}{1.77} \cdot \frac{1}{\sqrt{\epsilon - 1}}$$

$\lambda_0$ = free space wavelength
$c$ = dielectric constant and on the other hand the smaller diameter $d_2$ can be calculated by:

$$d_2 \approx \frac{\lambda_0}{2.80} \cdot \frac{1}{\sqrt{\epsilon - 1}}$$

Antenna beam widths and sidelobe suppression is influenced by $d_2$ and the antenna length 1.

Good results have been obtained by choosing
$d_1 = 2,0$ cm
$d_2 = 1,2$ cm
$l = 2,5$ cm
$\epsilon = 3,7$ and a diameter of 1,0 cm for the halve wavelength resonator disc when using the antenna in the x-band.

It will be understood that the above description of the present invention is susceptible to various modifications, changes and adaptions, and the same are intended to be comprehended within the meaning and range of equivalents of the appended claims.

We claim:

1. In a microwave transceiver including an antenna and a self-oscillating semiconductor mixer stage for both generating a microwave signal to be transmitted via the antenna and mixing that microwave signal with reflected microwave signal components received by the antenna, the mixer stage being composed of a nonlinear microwave diode connected to give the stage a negative impedance to permit oscillation and to effect mixing, and a half-wavelength disc-type resonator providing a resonant circuit for the oscillator and having the form of a stripline piece element composed of two strip conductors between which the microwave diode is electrically conductively connected, the antenna being a dielectric antenna disposed on one of the strip conductors, the diode having at least one lead which is brought through the resonator, and the transceiver further including a high frequency choke disposed on the side of the resonator facing away from the antenna and connected to the one diode lead, the improvement wherein said resonator and said antenna are constructed to be axially symmetrical and are positioned coaxially to one another and said microwave diode is positioned coaxially with respect to said resonator and said antenna.

2. In a microwave transceiver for a Doppler radar system, which transceiver includes an antenna and a self-oscillating semiconductor mixer stage for both generating a microwave signal to be transmitted via the antenna and mixing that microwave signal with reflected microwave signal components received by the antenna, the mixer stage being composed of a nonlinear microwave diode connected to give the stage a negative impedance to permit oscillation and to effect mixing, and a half-wavelength disc-type resonator providing a resonant circuit for the oscillator and having the form of a stripline piece element composed of two strip conductors between which the microwave diode is electrically conductively connected, the antenna being a dielectric antenna disposed on one of the strip conductors, the diode having at least one lead which is brought through the resonator, and the transceiver further including a high frequency choke disposed on the side of the resonator facing away from the antenna and connected to the one diode lead, the improvement wherein said resonator and said antenna are constructed to be axially symmetrical and are positioned coaxially to one another and said microwave diode is positioned coaxially with respect to said resonator and said antenna.

3. An arrangement as defined in claim 1 wherein said microwave diode is disposed in the center of said disc-type resonator, and said one diode lead is brought through said resonator in the immediate vicinity of said microwave diode.

4. An arrangement as defined in claim 1 or 3 wherein said antenna presents a base surface which rests directly on said one strip conductor and is significantly larger than said one strip conductor.

5. An arrangement as defined in claim 4 wherein said antenna has the form of a cone frustum whose large base rests directly on said one strip conductor and has at least one of its dielectric constant and large base diameter selected to achieve the desired electrical coupling between said antenna and said stage.

6. An arrangement as defined in claim 5 wherein the other said strip conductor is approximately of the same size as said large base of said antenna.

7. An arrangement as defined in claim 4 wherein the other said strip conductor is approximately of the same size as said antenna base surface.

8. An arrangement as defined in claim 1 or 3 further comprising a heat sink body to which the other said strip conductor is heat conductively connected, and wherein said microwave diode includes a heat emitting portion extending into said heat sink body.

9. An arrangement as defined in claim 1 or 3 wherein said one diode lead is connected as a direct voltage supply lead and as a means for removing the intermediate frequency signal generated by the mixing operation.

10. An arrangement as defined in claim 1 or 3 further comprising a capacitor connecting said one diode lead to the other said strip conductor at a location outside of said resonator.

11. An arrangement as defined in claim 1 or 3 wherein said microwave diode is a BARITT diode.

12. An arrangement as defined in claim 1 or 3 wherein said antenna has the form of a cone frustum whose large base surface rests directly on, and is significantly larger than, said one strip conductor.

* * * * *